United States Patent
Alberhasky et al.

(10) Patent No.: US 9,059,306 B2
(45) Date of Patent: Jun. 16, 2015

(54) SEMICONDUCTOR DEVICE HAVING DMOS INTEGRATION

(75) Inventors: Scott J. Alberhasky, Portland, OR (US); David Harper, Battle Ground, WA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 13/270,780

(22) Filed: Oct. 11, 2011

(65) Prior Publication Data

US 2013/0087850 A1    Apr. 11, 2013

(51) Int. Cl.
| | |
|---|---|
| *H01L 29/66* | (2006.01) |
| *H01L 21/336* | (2006.01) |
| *H01L 21/8234* | (2006.01) |
| *H01L 29/78* | (2006.01) |
| *H01L 29/417* | (2006.01) |
| *H01L 27/088* | (2006.01) |

(52) U.S. Cl.
CPC .... *H01L 21/823418* (2013.01); *H01L 29/7835* (2013.01); *H01L 29/4175* (2013.01); *H01L 27/088* (2013.01); *H01L 21/823475* (2013.01); *H01L 21/823487* (2013.01)

(58) Field of Classification Search
CPC ............. H01L 21/823418; H01L 21/823475; H01L 21/823487; H01L 27/088; H01L 29/4175; H01L 29/7835; H01L 29/7816

USPC ......... 257/327–331, 334–337, 341, 343, 391, 257/E29.119, E29.268, E21.417; 438/107, 438/204, 206, 268, 270, 275
See application file for complete search history.

(56) References Cited

U.S. PATENT DOCUMENTS

| | | | | |
|---|---|---|---|---|
| 5,424,231 | A | * | 6/1995 | Yang .............................. 438/270 |
| 2003/0173624 | A1 | * | 9/2003 | Choi et al. .................... 257/368 |
| 2006/0054967 | A1 | * | 3/2006 | Ludikhuize et al. .......... 257/327 |
| 2006/0231904 | A1 | * | 10/2006 | Kocon .......................... 257/391 |
| 2007/0235886 | A1 | * | 10/2007 | Yilmaz et al. ................ 257/779 |
| 2010/0155836 | A1 | * | 6/2010 | Hebert .......................... 257/334 |
| 2012/0056277 | A1 | * | 3/2012 | Lin ............................... 257/408 |

* cited by examiner

*Primary Examiner* — Fernando L Toledo
*Assistant Examiner* — Aaron Gray
(74) *Attorney, Agent, or Firm* — Advent, LLP

(57) ABSTRACT

Semiconductor devices that include a trench with conductive material for connecting a VDMOS device to a LDMOS device are described. The semiconductor devices include a substrate having a first region and a second region, wherein the second region is disposed on the first region. A trench extends from a top surface of the second region to the first region. The semiconductor substrate includes a VDMOS device formed proximate to the top surface of the second region and a LDMOS device that is also formed proximate to the top surface of the second region. The drain region of the VDMOS device is electrically connected to the source region of the LDMOS device by way of a conductive material disposed in the trench.

19 Claims, 7 Drawing Sheets

SEMICONDUCTOR DEVICE HAVING DMOS INTEGRATION

BACKGROUND

Diffused metal oxide semiconductor (DMOS) devices are used in power application devices because they complement both bipolar devices and complementary metal-oxide-semiconductor CMOS devices through bi-polar-CMOS-DMOS (BCD) processes. For example, vertical diffused metal oxide semiconductor (VDMOS) devices and laterally diffused metal oxide semiconductor (LDMOS) devices are two types of DMOS devices that are typically employed in buck converters, which are utilized as step-down DC (direct current) to DC converters.

SUMMARY

Semiconductor devices that include a trench with conductive material for connecting a VDMOS device to a LDMOS device are described. In one or more implementations, the semiconductor devices include a semiconductor substrate having a first region and a second region, wherein the second regions is disposed on the first region. A trench extends from a top surface of the second region to the first region. The semiconductor substrate includes a VDMOS device and a LDMOS device formed proximate to the top surface of the second region. The VDMOS device includes a drain region formed in the first region and at least one source region formed in the second region. The LDMOS device includes a drain region and a source region formed in the second region. The drain region of the VDMOS device is electrically connected to the source region of the LDMOS device by way of a conductive material disposed in the trench.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a diagrammatic partial cross-sectional view illustrating a semiconductor device in accordance with an example implementation of the present disclosure, wherein the semiconductor device includes a VDMOS device and a LDMOS device integrated in the semiconductor substrate.

FIG. 1B is a diagrammatic partial cross-sectional view illustrating a semiconductor device in accordance with another example implementation of the present disclosure, wherein the VDMOS device includes a diffusion region, the LDMOS device includes a RESURF region, the VDMOS device is formed using a first semiconductor substrate, and the LDMOS device is formed using a second semiconductor substrate that is discrete from the first semiconductor substrate.

DETAILED DESCRIPTION

Overview

Techniques are described to fabricate semiconductor devices that include a trench with conductive material for connecting a VDMOS device to a LDMOS device. In one or more implementations, the semiconductor devices include a semiconductor substrate having a first region and a second region, wherein the second region is disposed on the first region. The semiconductor substrate includes a trench that extends from a top surface of the second region to the first region. The semiconductor substrate includes a VDMOS device and an LDMOS device formed proximate to the top surface of the second region. The VDMOS device includes a drain region formed in the first region and at least one source region formed in the second region. The LDMOS device includes a drain region and a source region formed in the second region. The drain region of the VDMOS device is electrically connected to the source region of the LDMOS device by way of a conductive material disposed in the trench. In one or more implementations, the LDMOS device and the VDMOS device may be integrated onto a single semiconductor substrate. In other implementations, the VDMOS device may be fabricated using a first substrate, and the LDMOS device may be fabricated using a second substrate that is discrete from the first substrate.

The semiconductor devices of the present disclosure provide a buck converter design having the VDMOS device as a low-side field-effect-transistor (FET) and the LDMOS device as a high-side field-effect-transistor. By electrically connecting the drain region of the VDMOS device to the source region of the LDMOS device by way of the conductive material in the trench, the backside of the substrate may be utilized to output drain current from the VDMOS device (e.g., low-side FET). Thus, when the semiconductor devices are converted into individual die, the top surface of the die may be utilized for wiring of other nodes in the buck converter.

In the following discussion, an example semiconductor device is first described. Exemplary procedures are then described that may be employed to fabricate the example semiconductor device.

Example Implementations

Figure 1A:
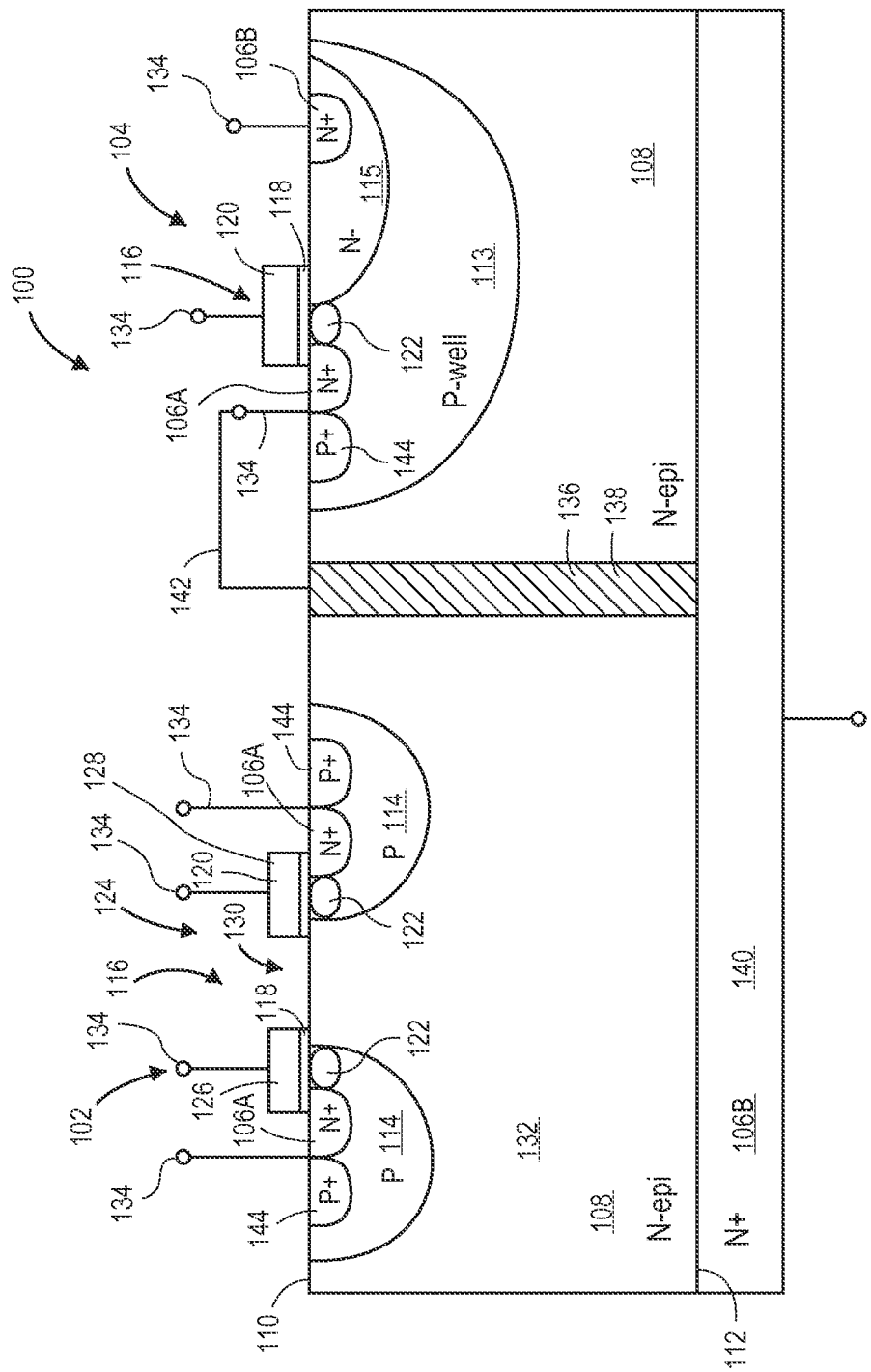
Figure 1B:
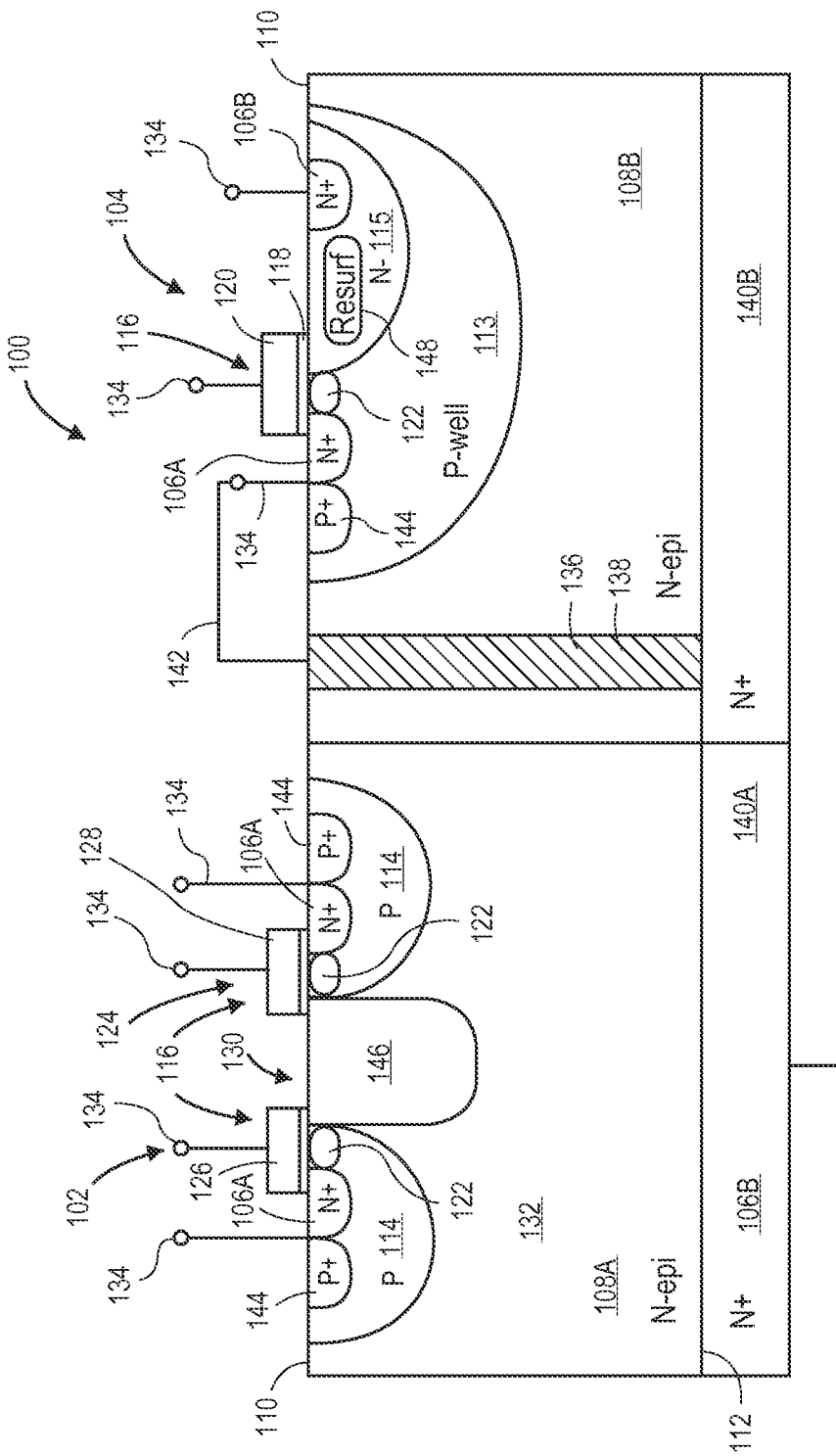

FIGS. 1A through 1B illustrate semiconductor devices 100 in accordance with example implementations of the present disclosure. As shown, the semiconductor devices 100 include a vertical diffused metal oxide semiconductor (VDMOS) device 102 and a laterally diffused metal oxide semiconductor (LDMOS) device 104. The VDMOS and LDMOS devices 102, 104 include one or more active regions 106 (e.g., source regions 106A, drain regions 106B) formed in a semiconductor substrate 108. For instance, the VDMOS device 102 may include one or more source regions 106A and a single drain region 106B. The LDMOS device 104 may include a single source region 106A and a single drain region 106B. The active regions 106 are utilized to create integrated circuit device technology (e.g., metal-oxide-semiconductor (MOS) technology, microelectromechanical systems (MEMS) technology, etc.). The active regions 106 may be configured in a variety of ways. In an implementation, the active regions 106 are capable of providing charge carriers within the substrate 108. For example, an active silicon region 106 may be comprised of an n-type diffusion region (e.g., a first conductivity type) that is capable of providing extra conduction electrons as charge carriers. In another example, an active silicon region 106 may be comprised of a p-type diffusion region (e.g., a second conductivity), that is capable of providing extra holes as charge carriers. The one or more active regions 106 (e.g., the source region 106A, the drain region 106B) of the LDMOS device 104 are formed proximate (e.g., adjacent) to a top surface 110 of the substrate 108. The one or more source regions 106A of the VDMOS device 102 are formed proximate (e.g., adjacent) to the surface 110 of the substrate 108. The drain region 106B of the VDMOS device 102 is formed proximate to the bottom surface 112 of the substrate 108.

The source regions 106A of the VDMOS device 102 (two source regions 106A are shown) are formed in body regions 114 (e.g., a first source region 106A is formed in a first body region 114 and the second source region 106A is formed in a second body region 114). The body regions 114 are comprised of a dopant material of a second conductivity type (e.g., p-type material). In one or more implementations, the source regions 106A, and the body regions 114 may be self-aligned regions fabricated through suitable self-alignment implantation techniques (e.g., implantation, annealing, etc.). In one or more implementations, the body regions 114 may have a dopant concentration of about $1 \times 10^{16}/cm^3$ to about $1 \times 10^{18}/cm^3$ of the second conductivity type.

The LDMOS device 104 may be formed in a well region 113 of the second conductivity type. As shown, the source region 106A is formed in the well region 113, and the drain region 106B is formed in an extended drain region 115. The extended drain region 115 functions as a drift region when the LDMOS device 104 is operational. The electric field across the extended drain region 115 may be manipulated by the doping profile and the thickness of the extended drain region 115. Thus, it is contemplated that various doping profiles and thicknesses of the extended drain region 115 may be utilized depending on the requirements (e.g., breakdown voltage value, operating voltages, etc.) of the LDMOS device 104. In one or more implementations, the extended drain region 115 may be formed from a dopant dose (of the first conductivity type) of approximately $1 \times 10^{11}/cm^2$ to approximately $1 \times 10^{14}/cm^2$. However, it is contemplated that other dopant doses may be utilized depending on the requirements (e.g., the on-state resistance, etc.) of the LDMOS device 104. As shown, the extended drain region 115 may be bounded by the well region 113. In one or more implementations, the well region 113 may have a dopant concentration of about $1 \times 10^{16}/cm^3$ to about $1 \times 10^{18}/cm^3$ of the second conductivity type.

The substrate 108 comprises a base material utilized to form one or more integrated circuit devices through various fabrication techniques such as photolithography, ion implantation, deposition, etching, and so forth. In one or more implementations, the substrate 108 comprises a portion of a silicon wafer that may be configured in a variety of ways. For example, the substrate 108 may comprise a portion of an n-type silicon wafer or a portion of a p-type silicon wafer. In an implementation, the substrate 108 may comprise group V elements (e.g., phosphorus, arsenic, antimony, etc.) configured to furnish n-type charge carrier elements. In another implementation, the substrate 108 may comprise group IIIA elements (e.g., boron, etc.) configured to furnish p-type charge carrier elements.

The VDMOS and LDMOS devices 102, 104 each include a gate 116 formed over the top surface 110. As shown, the gate 116 may include a first layer 118, such as a dielectric layer, disposed between the surface 110 and a second layer 120 (e.g., a polycrystalline silicon (polysilicon) layer or a metal electrode layer). In one or more implementations, the first layer 118 may comprise a gate oxide material, such as silicon dioxide ($SiO_2$), a nitride material, a high-κ material, or the like. The second layer 120 may further include a silicide material to lower the resistivity of the layer 120. In various implementations, the thickness of the gate 116 may range from approximately one hundred (100) Angstroms to approximately one hundred thousand (100,000) Angstroms. However, the thickness of the gate 116 may vary as a function of the requirements (e.g., manufacturability, operating frequency, gain, efficiency, thickness, etc.) of the VDMOS and LDMOS devices 102, 104. Conduction regions 122 are formed under each gate 116 when a voltage of correct polarity and a value greater than a threshold voltage ($V_t$) of the respective device 102, 104 is applied to the respective gate 116. The conduction regions 122 establish a conducting channel through which charge carriers (e.g., majority carriers) can travel between the source regions 106A and the drain region 106B.

The gate 116 of the VDMOS device 102 may be a dual-gate 124. The dual-gate 124 comprises a first gate region 126 and a second gate region 128 that define a gap 130 there between. The gap 130 serves to reduce the gate to drain capacitance ($C_{gd}$) of the VDMOS device 102. As shown in FIGS. 1A and 1B, the first gate region 126 is formed at least partially over a first source region 106A and a first body region 114 of the VDMOS device 102. The second gate region 128 is formed at least partially over a second source region 106A and a second body region 114 of the VDMOS device 102.

The semiconductor device 100 also includes an epitaxial region 132 that is configured as a path for majority carriers to travel when the VDMOS and/or the LDMOS devices 102, 104 are operational. The epitaxial region 132 is comprised of material of the first conductivity type. However, the doping profile of the epitaxial region 132 is lower than the doping profile of the source and the drain regions 106A, 106B. For example, the epitaxial region 132 may have a dopant concentration of about $1 \times 10^{14}/cm^3$ to about $1 \times 10^{17}/cm^3$ of the first conductivity type. The electric field across the epitaxial region 132 may be manipulated by the doping profile and the thickness of the epitaxial region 132 when the devices 102, 104 are operational. Thus, it is contemplated that various doping profiles and thicknesses of the epitaxial region 132 may be utilized depending on the requirements (e.g., breakdown voltage value, operating voltages, etc.) of the semiconductor device 100.

The source regions 106A, the drain regions 106B, and the gates 116 have contacts 134 (e.g., electrodes) that provide electrical interconnection functionalities between various components of device 100. The contacts 134 may be configured in a variety of ways. For example, the contacts 134 may be comprised of a polysilicon material, a metal one (metal 1) material, a metal two (metal 2) material, and so forth. In some applications, the contacts 134 may be vias that provide a vertical electrical connection between different layers of the device 100.

The semiconductor device 100 further includes a trench 136 defined in the substrate 108 having a conductive material 138 deposited therein. As shown, the trench 136 extends from about the top surface 110 to a substrate 140 of the first conductivity type (shown as an N+ substrate in FIGS. 1A and 1B). For example, the substrate 140 may be described as a first region and the substrate 108 may be described as a second region disposed on the first region. Thus, the trench 136 may extend the depth of the epitaxial region 132. The substrate 140 may function as the drain 106B for the VDMOS device 102. In one or more implementations, the substrate 140 may be unitary with the substrate 108 (e.g., a highly doped portion of the substrate 108). In another implementation, the substrate 140 may be a discrete substrate that is coupled to the substrate 108 through various semiconductor fabrication processing steps. The conductive material 138 provides an electrical interconnection between the substrate 140 and a contact 142 that connects to the source 106A of the LDMOS device 104. Thus, the drain 106B (e.g., the substrate 140) of the VDMOS 102 is connected to the source 106A of the LDMOS 104 by way of the contact 142 and the conductive material 138. The contact 142 may be configured in a variety of ways. For example, the contact 142 may be comprised of a polysilicon material, a metal one (metal 1) material, a metal two (metal 2) material, and so forth. It is contemplated that the conductive material 138 may also be comprised of one or more electrically conductive materials. For example, the conductive material 138 may be an N+ polysilicon material, or the like. In an implementation, the trench 136 and the conductive material 138, viewed together, may be an N+ plug. In a specific implementation, the trench 136 may be about one and a half (1.5) microns deep.

As shown in FIGS. 1A and 1B, the semiconductor device 100 may also include body contact regions 144 that are comprised of a second conductivity type (shown as P+ region in FIGS. 1A and 1B). In one or more implementations, the source regions 106A and the body contact regions 136 are tied together by the contacts 134 to improve reliability of the device 100 and to reduce parasitic effects.

FIG. 1B illustrates another implementation of the semiconductor device 100 where the VDMOS device 102 is formed in a first semiconductor substrate 108A, and the LDMOS device 104 is formed in a second semiconductor substrate 108B that is discrete from the first semiconductor substrate 108A. As shown, a substrate 140A (e.g., first region) of the first conductivity type is disposed below the first semiconductor substrate 108A (e.g., second region). Likewise, a substrate 140B (e.g., third region) of the first conductivity type is disposed below the second semiconductor substrate 108B (e.g., fourth region). The VDMOS 102 and the LDMOS 104 may be fabricated using different semiconductor substrates (e.g., a first semiconductor substrate 108A, a second semiconductor substrate 108B) and then strategically packaged proximate to one another. In an implementation, during one or more packaging steps, the semiconductor substrate 108A may be positioned adjacent the semiconductor substrate 108B so that the first substrate 140A is in electrical contact with the substrate 140B. As shown in FIG. 1B, the trench 136 is formed in second substrate 108B. This implementation may allow for the VDMOS device 102 and/or the LDMOS device 104 to be subjected to less semiconductor fabrication processing steps.

As shown in FIG. 1B, the VDMOS device 102 may also include a diffusion region 146 of a first conductivity type disposed in the epitaxial region 132. The diffusion region 146 is encompassed by the epitaxial region 132 and extends from about the first surface 110 to below at least one of the body regions 114. The diffusion region 146 has a doping concentration that is greater than the doping concentration of the epitaxial region 132 to reduce the channel resistance of the VDMOS device 102. For example, the diffusion region 146 may have a dopant concentration of about $1\times10^{15}/cm^3$ to about $1\times10^{17}/cm^3$ of the first conductivity type. While not illustrated in FIG. 1A, it is contemplated that the VDMOS device 102 shown in FIG. 1A may also include the diffusion region 146.

The extended drain region 115 may include a reduced surface field (RESURF) region 148 that functions to create a uniform drift region field to manipulate the LDMOS device 104 breakdown voltage. The RESURF region 148 comprises a doped region of a second conductivity type enclosed by the extended drain region 115. While the RESURF region 148 is shown in FIG. 1B, it is contemplated that the semiconductor device 100 shown in FIG. 1A may also include a RESURF region 148 in some implementations.

While FIGS. 1A and 1B illustrate the semiconductor device 100 as including an n-channel VDMOS device 102 and an n-channel LDMOS device 104, the semiconductor device 100 may also be fabricated as to include p-channel VDMOS and LDMOS devices. It is understood that the VDMOS device 102 may be configured as a mirrored, dual-gate VDMOS device.

Example Fabrication Processes

Figure 2:
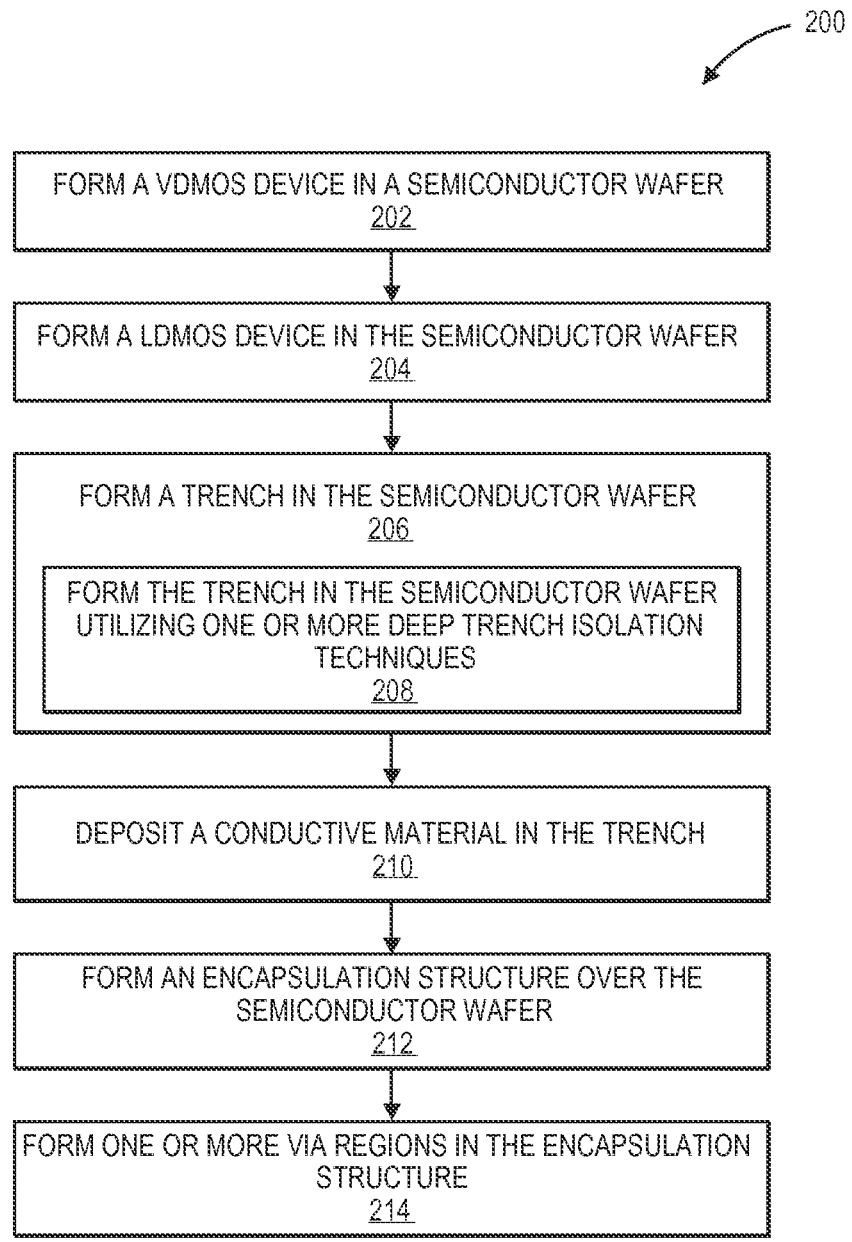
FIG. 2 is a flow diagram illustrating a process in an example implementation for fabricating semiconductor devices having DMOS integration, such as the devices shown in FIGS. 1A and 1B.
Figure 3A:
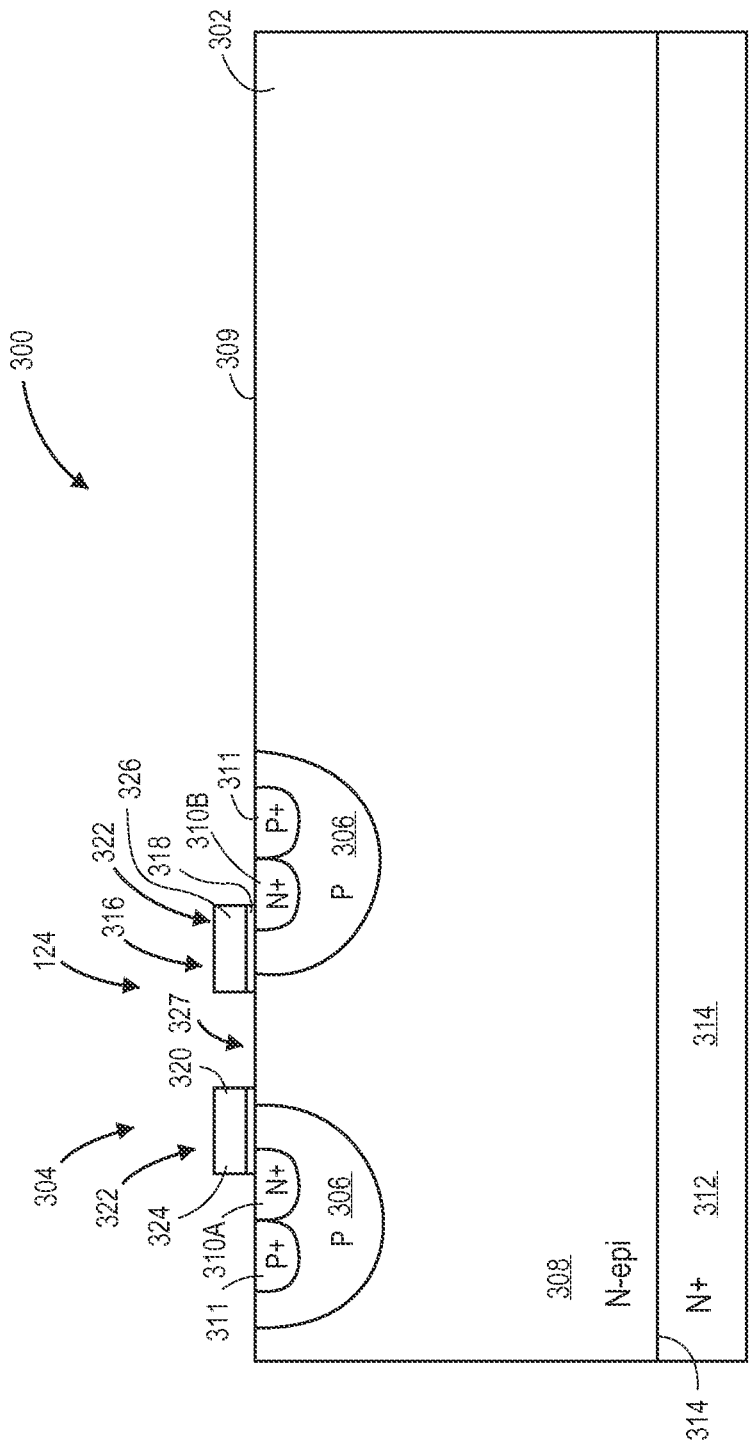
FIGS. 3A through 3D are diagrammatic partial cross-sectional views illustrating the fabrication of a semiconductor device having DMOS integration, such as the devices shown in FIGS. 1A and 1B, in accordance with the process shown in FIG. 2.

FIG. 2 illustrates example process 200 that employs semiconductor fabrication techniques to fabricate semiconductor devices having a VDMOS and a LDMOS formed in a semiconductor substrate, such as the devices 100 shown in FIGS. 1A and 1B. FIGS. 3A through 3D illustrate formation of example semiconductor devices 300 in an example semiconductor wafer 302. As illustrated in FIG. 2, a VDMOS device is formed using a semiconductor wafer (Block 202). FIG. 3A illustrates the wafer 302 with a VDMOS device 304 formed therein. For example, the VDMOS device 304 includes one or more body regions 306 of a second conductivity type which may be formed through suitable body region formation techniques (e.g., dopant implantation, annealing, etc.) in an epitaxial region 308 of the first conductivity type. As shown, the body regions 306 are formed proximate to the top surface 309 of the wafer 302. Source regions 310 of the first conductivity type are formed in each of the body regions 306 through suitable source region formation techniques (e.g., dopant implantation, annealing, etc.). Body contact regions 311 of the second conductivity type are formed proximate (e.g., adjacent) to the source regions 310 to improve reliability of the device 300 and to reduce parasitic effects.

As illustrated in FIG. 3A, the wafer 302 includes a substrate 312 of a first conductivity type proximate (e.g., adjacent) to the bottom surface 314 of the wafer 302. In an implementation, the substrate 312 may be formed (e.g., implanted, etc.) in the wafer 302. In another implementation, the substrate 312 may be coupled to the wafer 302 through one or more suitable coupling techniques (e.g., adhesion, etc.). The substrate 312 is configured to function as the drain region 314 of the VDMOS device 304. In an implementation, the substrate 312 may be referred to as the first region, and the wafer 302 may be referred to as the second region.

One or more gates 316 for the VDMOS device 304 may be formed over the surface 309 of the wafer 302. For example, an oxide layer 318 and a polysilicon layer 320 are deposited over the top surface 309 of the wafer 302. The oxide layer 318 and the polysilicon layer 320 are defined through various gate definition processes. In an implementation, the layers 318, 320 may be subjected to a suitable photolithography process and a suitable etching process to form dual-gate 322. As shown in FIG. 3A, the dual-gate 322 comprises a first gate region 324 and a second gate region 326 that define a gap 327 for reducing the gate to drain capacitance of the VDMOS device 304. The first gate region 324 is at least partially formed over a first source region 310A, and a second gate region 326 is at least partially formed over a second source region 310B.

Figure 3B:
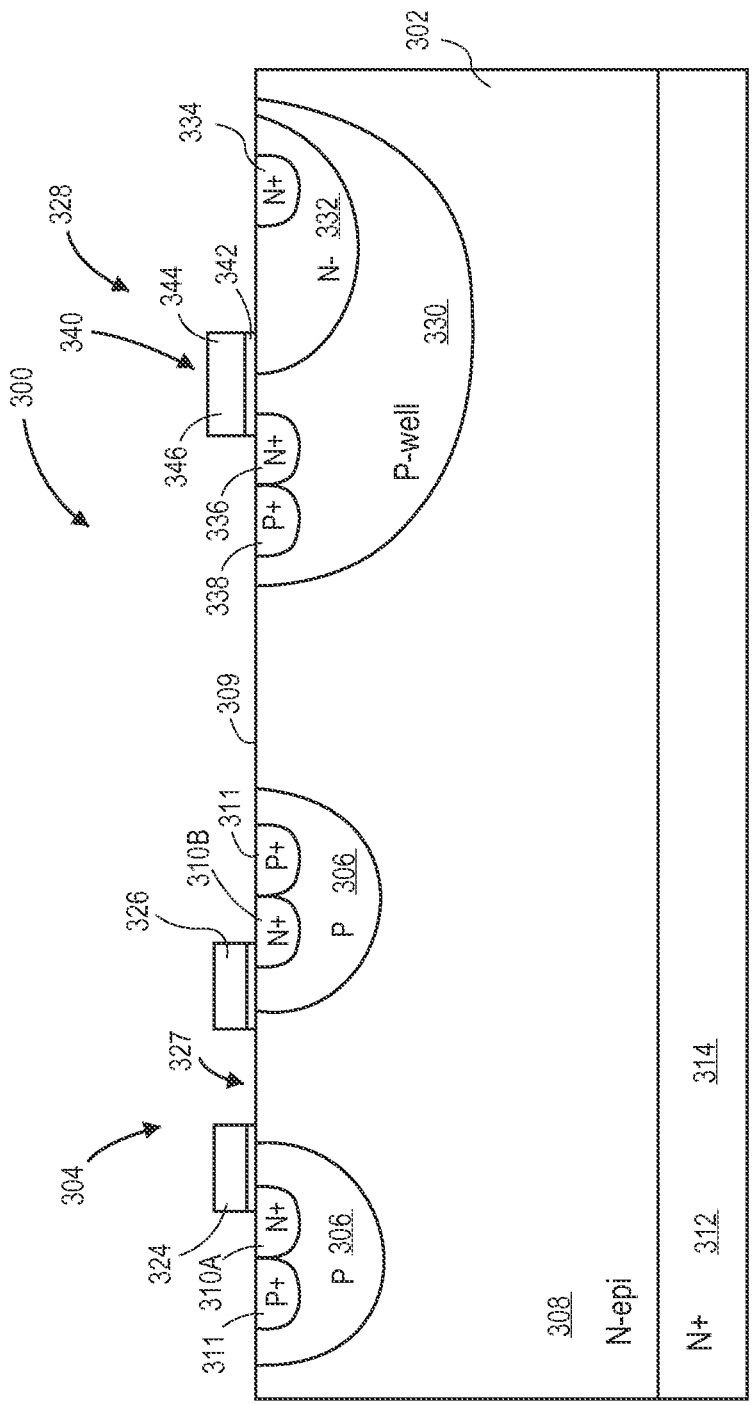

A LDMOS device is formed using the semiconductor wafer (Block 204). As shown in FIG. 3B, the wafer 302 includes a LDMOS device 328. The LDMOS device 328 is formed in a well 330 of the second conductivity type. The well 330 may be implanted in the epitaxial region 308 proximate (e.g., adjacent) to the surface 309 through one or more suitable well formation techniques (e.g., dopant implantation, annealing, etc.). An extended drain region 332 is then implanted (e.g., ion implantation, etc.) into the well 330 to function as a drift region when the LDMOS device 328 is operational. A drain region 334 of the first conductivity type and a source region 336 of the first conductivity type are formed (e.g., implantation, annealing, etc.) in the LDMOS device 328. As shown in FIG. 3B, the drain region 334 is formed in the extended drain region 332, and the source region 336 is formed in the well 330. The LDMOS device 328 also includes a body contact region 338 of the second conductivity type formed proximate (e.g., adjacent) to the source region 336.

A gate 340 for the LDMOS device 328 is formed over the surface 309. As described above with respect to the one or more gates 316, an oxide layer 342 and a polysilicon layer 344 are deposited over the surface 309. The layers 342, 344 are then subjected to one or more photolithography processes and selectively etched to form the gate region 346. As shown, the gate region 346 is at least partially formed over the source region 336 and the extended drain region 332.

Figure 3C:
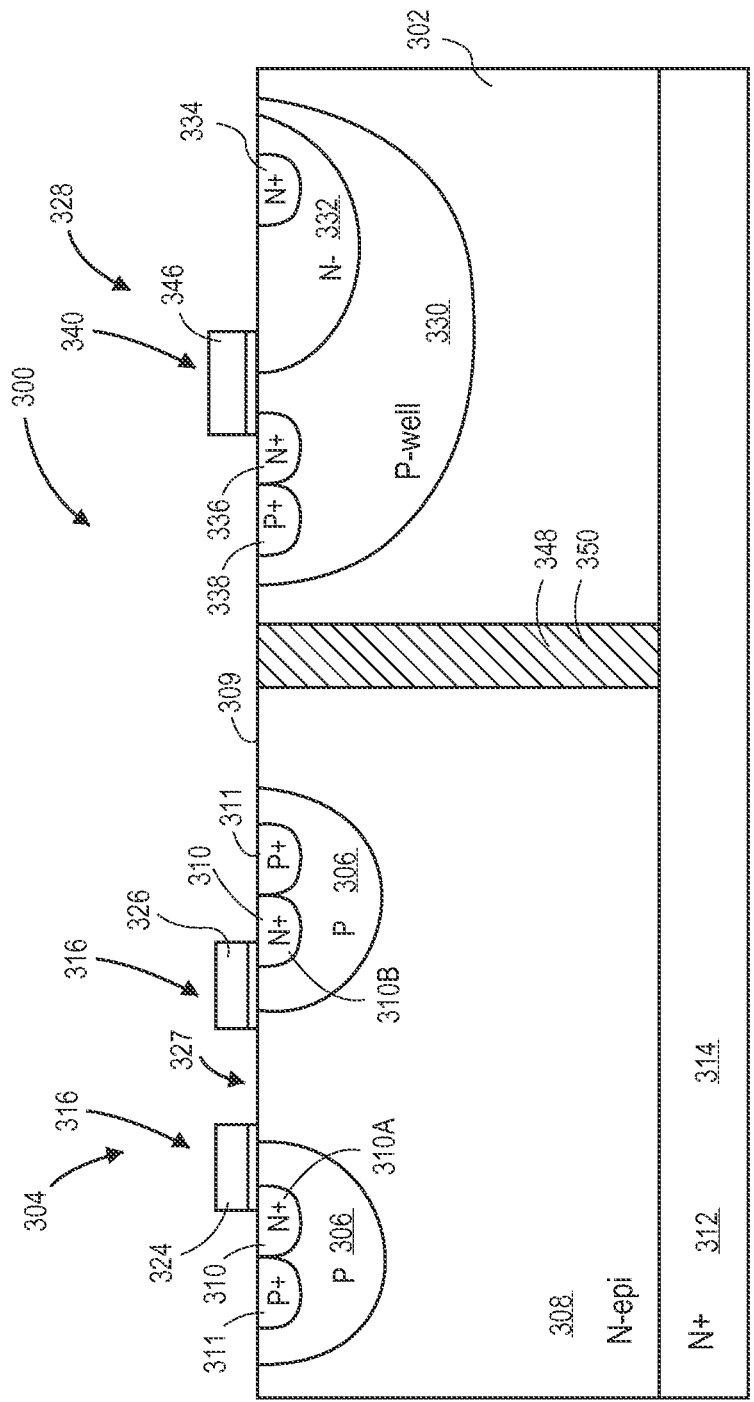

A trench is formed in the semiconductor wafer (Block 206). As shown in FIG. 3C, a trench 348 is formed in the wafer 302. In an implementation, the trench may be formed through one or more suitable deep trench isolation techniques (Block 208). In an example implementation, the trench 348 may be about one and a half (1.5) microns deep. The trench 348 extends from the surface 309 to the substrate 312. A conductive material is then deposited in the trench (Block 210). For example, a conductivity material 350 may be deposited through physical vapor deposition, chemical vapor deposition, electrochemical deposition, and so forth. The conductive material 350 may be comprised of any suitable conductive material, such as a doped polysilicon material (e.g., N+ doped polysilicon), metal (e.g., copper, aluminum), or the like. In an implementation, the trench 348 and the conductive material 350 may comprise an N+ plug.

Figure 3D:
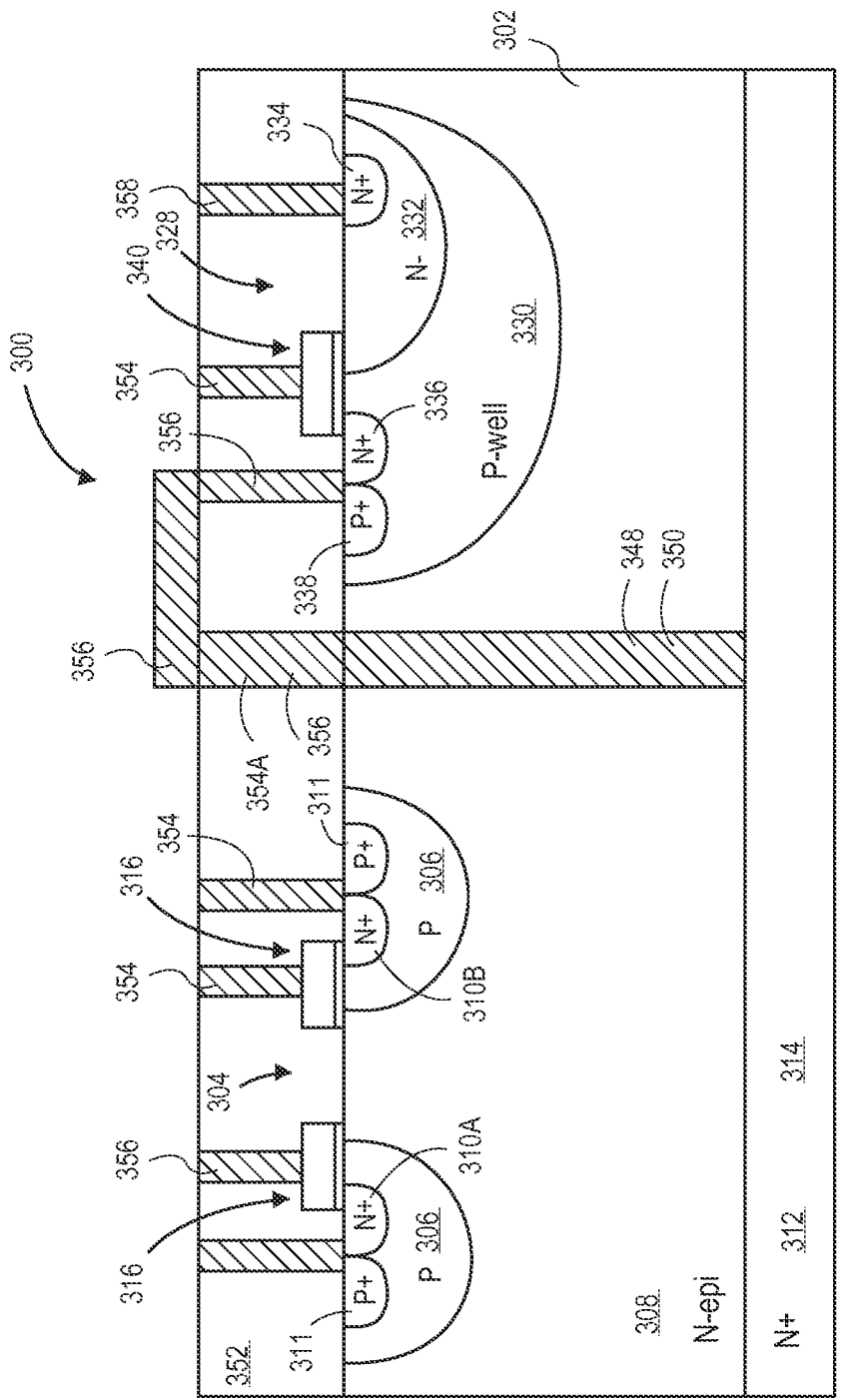

An encapsulation structure is formed over the surface of the semiconductor wafer (Block 212). As shown in FIG. 3D, an encapsulation structure 352 is formed over the surface 309 of the wafer 302 to enclose the gates 316, 340. The encapsulation structure 352 may be configured in a variety of ways. For example, the encapsulation structure 352 may comprise a dielectric material, such as a silicon dioxide ($SiO_2$) material, a benzocyclobutene (BCB) material, or the like. One or more via regions are formed in the encapsulation structure (Block 214). FIG. 3D also illustrates via regions 354 formed through one or more etching processes (e.g., wet etching, dry etching) in the encapsulation structure 352 to allow for connections to the gates 316, 340, the source regions 310, 336, the drain region 334, and the conductive material 350. A conductive material 356 is deposited (e.g., e.g., physical vapor deposition, chemical vapor deposition, molecular beam epitaxy, etc.) in the via regions 354 to form contacts 358 that provide electrical interconnections between various components of the semiconductor device 300. In one or more implementations, the conductive material 356 may be comprised of a polysilicon material, a metal 1 material, a metal 2 material, and so forth. As shown in FIG. 3D, the substrate 312 (e.g., drain region 314 of the VDMOS device 304) is electrically coupled to the source region 336 of the LDMOS device 328 through the conductive material 350 deposited in the trench 348 and the conductive material 356 deposited in the via region 354A.

It will be understood that above described fabrication techniques are only exemplary and the above fabrication techniques may be performed differently from the description above. For example, the LDMOS device may be fabricated before the VDMOS device may be fabricated, and so forth. It will also be understood that proper steps will be utilized to protect the VDMOS device and/or the LDMOS device from further processing steps when the other device (the VDMOS device or the LDMOS device) is being fabricated.

Furthermore, while FIGS. 3A through 3D illustrate a semiconductor device 300 having an n-channel VDMOS device 304 and a LDMOS device 328, the device 300 may also be fabricated to include p-channel VDMOS and/or LDMOS devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a semiconductor substrate having a first region and a second region disposed on the first region;
   a VDMOS device formed using the semiconductor substrate and disposed proximate to the top surface of the second region, the VDMOS device having a first drain region formed in the first region and at least one first source region formed in the second region, the VDMOS device including a diffusion region disposed adjacent to the second region;
   a LDMOS device formed using the semiconductor substrate and disposed proximate to the top surface of the second region, the LDMOS device having a second drain region formed in the second region and a second source region formed in the second region, the LDMOS device including an extended drain region, the extended drain region including a reduced surface field region configured to modify a breakdown voltage of the LDMOS device;
   an encapsulation structure disposed over the semiconductor substrate;
   a first trench formed in the semiconductor substrate and through the encapsulation structure, the first trench extending from a top surface of the encapsulation structure to the first region;
   a second trench formed through the encapsulation structure, the second trench extending from the top surface of the encapsulation structure to the second source region; and
   a conductive material disposed directly over the top surface of the encapsulation structure and within the first trench and the second trench for electrically coupling the first drain region to the second source region.

2. The semiconductor device as recited in claim 1, wherein the conductive material comprises a doped polysilicon material.

3. The semiconductor device as recited in claim 1, wherein the VDMOS device comprises a dual-gate formed over the top surface of the second region, the dual-gate including a first gate region and a second gate region defining a gap there between.

4. The semiconductor device as recited in claim 1, wherein the second region comprises an epitaxial region having a dopant concentration of $1\times10^{14}/cm^3$ to $1\times10^{17}/cm^3$ of a first conductivity type.

5. The semiconductor device as recited in claim 4, wherein the at least one source region comprises at least one source region of the first conductivity type and formed in a body region of a second conductivity type, the body region disposed in the epitaxial region.

6. The semiconductor device as recited in claim 1, wherein the first region is discrete from the second region.

7. The semiconductor device as recited in claim 1, wherein the first region is unitary with the second region.

8. A semiconductor device comprising:
a first semiconductor substrate having a first region and a second region disposed on the first region;
a second semiconductor substrate having a third region and a fourth region disposed on the third region;
a VDMOS device formed using the first semiconductor substrate and disposed proximate to the top surface of the second region, the VDMOS device having a first drain region formed in the first region and at least one first source region formed in the second region, the VDMOS device including a diffusion region disposed adjacent to the second region;
a LDMOS device formed using the second semiconductor substrate and disposed proximate to the top surface of the fourth region, the LDMOS device having a second drain region formed in the fourth region and a second source region formed in the fourth region, the LDMOS device including an extended drain region, the extended drain region including a reduced surface field region configured to modify a breakdown voltage of the LDMOS device;
an encapsulation structure disposed over the first semiconductor substrate and the second semiconductor substrate; and
a first trench formed in the second semiconductor substrate and through the encapsulation structure, the first trench extending from a top surface of the encapsulation structure through the fourth region to the third region;
a second trench formed through the encapsulation structure, the second trench extending from the top surface of the encapsulation structure to the second source region; and
a conductive material disposed directly over the top surface of the encapsulation structure and within the first trench and the second trench for electrically coupling the first drain region to the second source region.

9. The semiconductor device as recited in claim 8, wherein the conductive material comprises a doped polysilicon material.

10. The semiconductor device as recited in claim 8, wherein the VDMOS device comprises a dual-gate formed over the top surface of the second region, the dual-gate including a first gate region and a second gate region defining a gap there between.

11. The semiconductor device as recited in claim 8, wherein the second region comprises an epitaxial region having a dopant concentration of $1\times10^{14}/cm^3$ to $1\times10^{17}/cm^3$ of a first conductivity type.

12. The semiconductor device as recited in claim 11, wherein the at least one source region comprises at least one source region of the first conductivity type and formed in a body region of a second conductivity type, the body region disposed in the epitaxial region.

13. The semiconductor device as recited in claim 8, wherein the first region is discrete from the second region.

14. The semiconductor device as recited in claim 8, wherein the first region is unitary with the second region.

15. A process comprising:
forming a VDMOS device using a semiconductor wafer, the semiconductor wafer having a first region and a second region disposed on the first region, the VDMOS device having a first drain region formed in the first region and at least one first source region formed in the second region, the VDMOS device including a diffusion region disposed adjacent to the second region;
forming a LDMOS device using the semiconductor wafer, the LDMOS device having a second drain region formed in the second region and a second source region formed in the second region, the LDMOS device including an extended drain region, the extended drain region including a reduced surface field region configured to modify a breakdown voltage of the LDMOS device;
forming an encapsulation structure over the top surface of the second region;
forming one or more via regions in the encapsulation structure;
forming a first trench in the semiconductor wafer and through the encapsulation structure, the first trench extending from a top surface of the encapsulation structure through the second region to the first region;
forming a second trench through the encapsulation structure, the second trench extending from the top surface of the encapsulation structure to the second source region; and
depositing a conductive material directly over the encapsulation structure and in the first trench and the second trench to electrically couple the first drain region to the second source region.

16. The process as recited in claim 15, wherein forming a trench further comprises forming a trench in the semiconductor wafer utilizing one or more deep trench isolation processes, the trench extending from a top surface of the second region to the first region.

17. The process as recited in claim 15, wherein the trench is 1.5 microns deep.

18. The process as recited in claim 15, wherein the VDMOS device comprises a dual-gate formed over the top surface of the second region, the dual-gate including a first gate region and a second gate region defining a gap there between.

19. The process as recited in claim 15, wherein depositing a conductive material further comprises depositing a doped polysilicon material in the trench.

* * * * *